United States Patent
Kim et al.

(10) Patent No.: US 8,756,464 B2
(45) Date of Patent: Jun. 17, 2014

(54) FLASH MEMORY DEVICE AND FLASH MEMORY PROGRAMMING METHOD EQUALIZING WEAR-LEVEL

(75) Inventors: Bumsoo Kim, Seongnam-si (KR); Hyunmo Chung, Seongnam-si (KR); Hanmook Park, Seongnam-si (KR)

(73) Assignee: OCZ Storage Solutions Inc., San Jose, CA (US)

( * ) Notice: Subject to any disclaimer, the term of this patent is extended or adjusted under 35 U.S.C. 154(b) by 378 days.

(21) Appl. No.: 12/811,001

(22) PCT Filed: Aug. 25, 2008

(86) PCT No.: PCT/KR2008/004965
§ 371 (c)(1),
(2), (4) Date: Jun. 28, 2010

(87) PCT Pub. No.: WO2009/084797
PCT Pub. Date: Jul. 9, 2009

(65) Prior Publication Data
US 2010/0287427 A1    Nov. 11, 2010

(30) Foreign Application Priority Data
Dec. 27, 2007    (KR) ........................ 10-2007-0139108

(51) Int. Cl.
| | | |
|---|---|---|
| *G11C 29/00* | (2006.01) | |
| *H03M 13/00* | (2006.01) | |
| *G11C 11/34* | (2006.01) | |
| *G11C 5/14* | (2006.01) | |
| *G06F 13/00* | (2006.01) | |
| *G11C 16/34* | (2006.01) | |
| *G11C 16/10* | (2006.01) | |
| *G11C 11/56* | (2006.01) | |
| *G11C 29/36* | (2006.01) | |
| *G11C 13/00* | (2006.01) | |
| *G06F 3/06* | (2006.01) | |
| *G06F 11/00* | (2006.01) | |
| *G06F 11/07* | (2006.01) | |
| *G06F 11/08* | (2006.01) | |
| *G06F 12/02* | (2006.01) | |
| *G06F 17/30* | (2006.01) | |

(52) U.S. Cl.
CPC ............ *G11C 16/3495* (2013.01); *G11C 16/10* (2013.01); *G11C 16/3436* (2013.01); *G11C 16/344* (2013.01); *G11C 16/349* (2013.01); *G11C 11/5628* (2013.01); *G11C 2211/5647* (2013.01); *G11C 29/36* (2013.01); *G11C 13/0035* (2013.01); *G06F 3/0679* (2013.01); *G06F 11/00* (2013.01); *G06F 11/0727* (2013.01); *G06F 11/08* (2013.01); *G06F 12/0246* (2013.01); *G06F 17/30218* (2013.01)
USPC ........... 714/721; 714/718; 714/719; 714/723; 714/758; 365/185.09; 365/185.29; 365/185.33; 365/201; 365/227; 711/170

(58) Field of Classification Search
CPC .. G11C 16/10; G11C 16/3436; G11C 16/344; G11C 16/349; G11C 16/3495; G11C 11/5628; G11C 2211/5647; G11C 29/36; G11C 13/0035; G11C 2029/36; G06F 3/0679; G06F 11/00; G06F 11/0727; G06F 11/08; G06F 12/0246; G06F 17/30218; G06F 13/1108; H03M 13/1108
USPC ........................ 714/718, 719, 721, 723, 758; 365/185.09, 185.29, 185.33, 201, 227; 711/170
See application file for complete search history.

(56) References Cited

U.S. PATENT DOCUMENTS

| | | | |
|---|---|---|---|
| 5,920,502 A | | 7/1999 | Noda et al. |
| 7,400,541 B2 * | | 7/2008 | Jang et al. ................ 365/189.07 |
| 7,518,922 B2 * | | 4/2009 | Maejima et al. ......... 365/185.17 |
| 7,702,875 B1 * | | 4/2010 | Ekman et al. .................. 711/170 |
| 8,112,608 B2 * | | 2/2012 | Perego et al. .................. 711/170 |
| 8,136,014 B2 * | | 3/2012 | Uchikawa et al. ............. 714/763 |
| 8,244,969 B2 * | | 8/2012 | McWilliams et al. ........ 711/103 |
| 2005/0157579 A1 * | | 7/2005 | Perego et al. ............. 365/230.03 |
| 2008/0247257 A1 * | | 10/2008 | Brown ........................... 365/227 |

| | | | |
|---|---|---|---|
| 2011/0080786 A1* | 4/2011 | Fernandes | 365/185.03 |
| 2011/0276741 A1* | 11/2011 | Subrahmanyam et al. | 711/6 |
| 2012/0134084 A1* | 5/2012 | Perego et al. | 361/679.01 |

FOREIGN PATENT DOCUMENTS

| | | |
|---|---|---|
| JP | 10-302485 A | 11/1998 |
| JP | 2005-228379 A | 8/2005 |

\* cited by examiner

*Primary Examiner* — John J Tabone, Jr.
(74) *Attorney, Agent, or Firm* — Hartman Global IP Law; Gary M. Hartman; Michael D. Winter

(57) ABSTRACT

Disclosed are a flash memory device and flash memory programming method that equalizes a wear-level. The flash memory device includes a memory cell array, an inversion determining unit to generate a programming page through inverting or not inverting a data page based on a number of '1's and '0's in the data page, a programming unit to store the generated programming page in the memory cell array; and a data verifying unit to read the programming page stored in the memory cell array, to restore the data page from the programming page according to whether an error exists in the read programming page, and to output the restored data page, and thereby can equalize a wear-level of a memory cell.

20 Claims, 8 Drawing Sheets

FLASH MEMORY DEVICE AND FLASH MEMORY PROGRAMMING METHOD EQUALIZING WEAR-LEVEL

CROSS-REFERENCE TO RELATED APPLICATIONS

This application is the U.S. national stage application of International Patent Application No. PCT/KR2008/004965, filed Aug. 25, 2008, which claims priority to Korean Application No. 10-2007-0139108, filed Dec. 27, 2007, the disclosures of each of which are incorporated herein by reference in their entirety.

TECHNICAL FIELD

The present invention relates to a flash memory device, and particularly, to a flash memory device for equalizing a wear-level of a flash memory and a flash memory programming method.

BACKGROUND ART

A flash memory, a non-volatile memory semiconductor, has been the focus of attention in many fields as a substitute storage medium for a hard disk in a PC or a server, as well as for a portable terminal and embedded system since the flash memory is resistant to impact, operable with a low power and has a high degree of integration.

The flash memory is required to perform an erase operation of a corresponding location first to renew once stored data, unlike a general block such as a hard disk.

That is, a write operation of the flash memory is performed through changing a value of a required memory cell into '0' in a state that values of all memory cells are initialized into '1'. As described above, to renew the stored data, every cell in the corresponding location is initialized into '1', and then the write operation is performed again.

In this instance, a read operation and the write operation are performed in page units. The page of the flash memory indicates bytes having a physically successive address. The erase operation is performed in block units unlike the read operation and the write operation. The block of the flash memory indicates a plurality of physically successive pages. According to conventional embodiments, a size of the page is 512 B to 4 KB and a size of the block is 16 KB to 512 KB.

According to conventional example embodiments, the page of the flash memory is classified into a main region and subsidiary region. The main region stores data and the subsidiary region stores information related to the data stored in the main region and information related to the page. The information stored in the subsidiary region is referred to as meta-information. Examples of the meta-information include Cyclic Redundancy Check (CRC) or Error Correction Codes (ECC) information. The CRC or ECC may be used when detecting an error or verifying physical damage of the page during the write operation or read operation.

All of the read, write, and erase operations of the flash memory may inflict electrical stress to a memory cell where data is stored and cause minute wear. Therefore, when the flash memory is used for a long time, the memory cell, at last, may come to a state where '0' is not normally discriminated from '1'.

Since a wear-level of the write operation and erase operation is much greater than a wear-level of the read operation, efforts to reduce a number of the write operations and erase operations occurring in a single memory cell as much as possible are required to extend a life span of the flash memory.

A conventional invention for equalizing the wear-level is a method of equalizing the wear-level in a block level that is a unit for the erase operation. That is, a method for managing the flash memory through recording a number of the erase operations and maintaining the number of the erase operations equal to or less than a certain number is suggested. The conventional method of equalizing the wear-level assumes that every memory cell belonged to a single block has the same wear-level. Also, the conventional method may not consider wear-level difference in each memory cell level.

DISCLOSURE OF INVENTION

Technical Goals

An aspect of the present invention provides a device and method for extending a life span of a memory cell using a new programming scheme.

Another aspect of the present invention also provides a device and method for a device and method for equalizing wear-level in a memory cell level using a new data detection scheme.

Technical Solutions

According to an aspect of the present invention, there is provided a memory device including a memory cell array, an inversion determining unit to generate a programming page through inverting or not inverting a data page based on a number of '1's and '0's in the data page, a programming unit to store the generated programming page in the memory cell array, and a data verifying unit to read the programming page stored in the memory cell array, to restore the data page from the programming page according to whether an error exists in the read programming page, and to output the restored data page.

According to another aspect of the present invention, there is provided a memory device including a memory cell array, a page dividing unit to divide a data page into a plurality of data sub-pages, an inversion determining unit to generate each programming page corresponding to each of the data sub-pages through inverting or not inverting each of the data sub-pages based on a number of '1's and '0's in each of the data sub-pages, and a programming unit to store each generated programming page to the memory cell array.

According to another aspect of the present invention, there is provided a memory programming method including determining whether to perform inversion of a data page based on a number of '1's and '0's in the data page, generating a programming page from the data page according to the determination on whether to perform inversion of the data page, storing the generated programming page in a memory cell array, reading the programming page stored in the memory cell array, determining whether to perform inversion of the read programming page depending on whether an error exists in the read programming page, and restoring the data page from the read programming page according to the determination on whether to perform inversion of the read programming page.

According to another aspect of the present invention, there is provided a memory programming method including dividing a data page into a plurality of data sub-pages, determining whether to perform inversion of each of the data sub-page based on a number of '1's and '0's in the each of the data sub-pages, generating a programming page corresponding to each of the data sub-pages from each of the data sub-pages according to the determination on whether to perform inversion of each of the data sub-pages, and storing each generated programming page to the memory cell array.

BEST MODE FOR CARRYING OUT THE INVENTION

Figure 1:
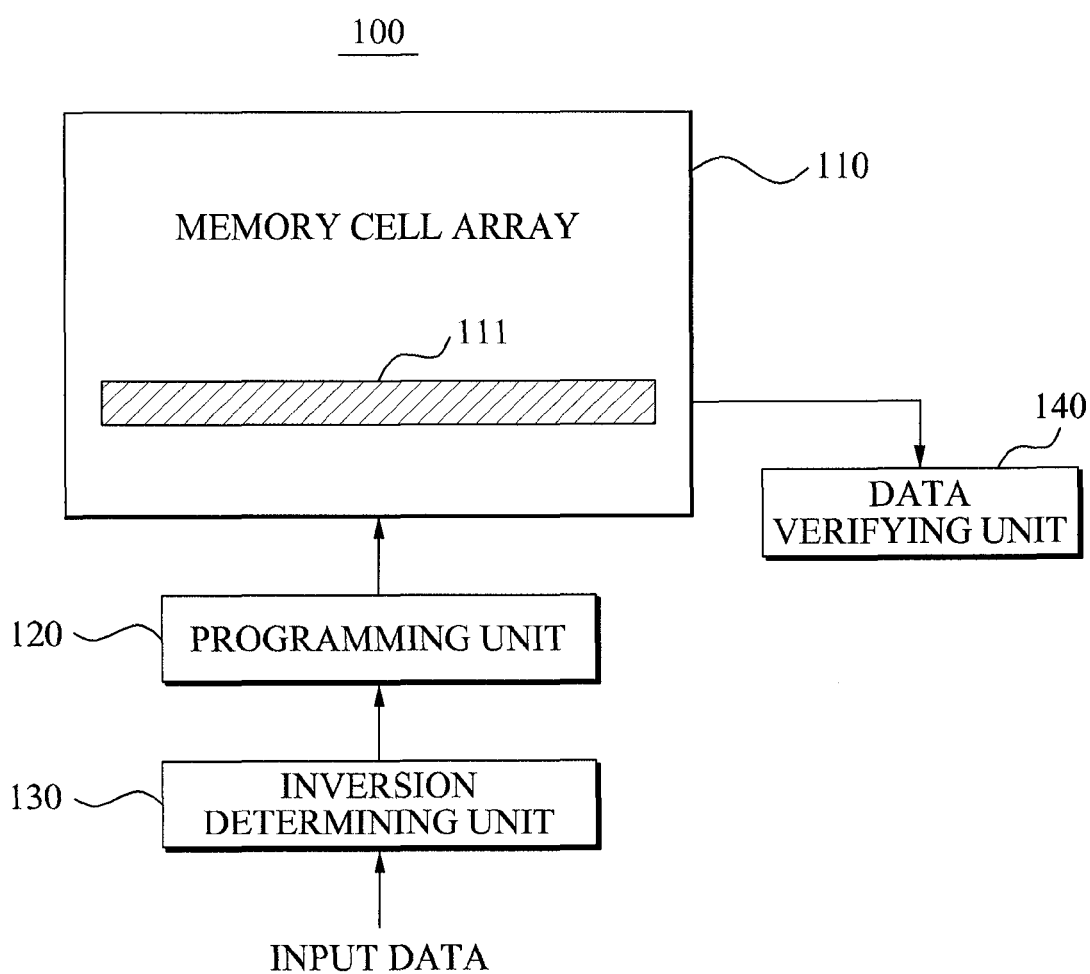
FIG. 1 illustrates a flash memory device according to an example embodiment.

Although a few example embodiments will be shown and described, the present invention is not limited to the described exemplary embodiments, wherein like reference numerals refer to the like elements throughout.

Every flash memory cell in a block that is a target for an erase operation does not have the same level of wear. The erase operation is to initialize a value of every memory cell in a corresponding block into '1'. In the block where the erase operation is performed, there are memory cells having a changed value from '0' to '1' and memory cells having a value remaining as '1' without change. In this instance, the memory cell having a value that is initially changed from '1' to '0' by a write operation and then changed from '0' to '1' by the erase operation has a greater wear-level than that of the memory cell having the value remaining as '1'.

Accordingly, as a number of the memory cells having a value continuously remaining as '1' even when the write operation and erase operation are iteratively performed, a wear-level of the corresponding block decreases, and thus a life span of the flash memory cell may be extended overall.

The flash memory device of the present invention may provide a method of minimizing a wear-level with respect for each memory cell, and thereby can extend a life span of the flash memory overall.

When a number of bits having a value '0' is greater than a number of bits having a value '1' in a page that is a target for the write operation, the flash memory device of the present invention may invert '0' and '1' and store the inverted value, thereby minimizing a number of memory cells having a value changed into '0'.

FIG. 1 illustrates a flash memory device 100 according to example embodiment.

Referring to FIG. 1, the flash memory device 100 includes a memory cell array 110, programming unit 120, inversion determining unit 130, and data verifying unit 140.

The memory cell array 110 may include a page 111.

Each of the programming unit 120, inversion determining unit 130, and data verifying unit 140 may be included in a peripheral circuit of the flash memory device or a controller of a predetermined computing system of the flash memory device 100.

The inversion determining unit 130 generates a programming page through inverting or not inverting a data page based on a number of '1's and '0's in the data page.

In the present specification, data that is a unit being simultaneously programmed and is handled by the controller (not illustrated) of the flash memory device 100 is referred to as a data page. Also, in the specification, data that is a unit being simultaneously programmed and is physically programmed to the page 111 of the memory cell array 110 is referred to as a programming page.

The terms 'data page' and 'programming page' denoted throughout the specification are to be specified for the above described function and use, however, a scope of right may not be limited by the terms.

The inversion determining unit 130 may generate the programming page through inverting the data page, when the number of '0's is greater than the number of '1's in the data page.

Although it is not described in detail, a physical programming operation with respect to the memory cell array 110 may be an operation of changing a value from '0' to '1'. In this instance, the inversion determining unit 130 may invert the data page and generate the programming page when the number of '1's is greater than the number of '0's in the data page.

Since the flash memory device 100 is to reduce a wear-level of a memory cell, varying an operation of the inversion determining unit 130 corresponding to the physical programming operation is apparent to those skilled in the art.

The programming unit 120 may store the generated programming page in the page 111 of the memory cell array.

In this instance, a data storing operation of the programming unit 120 may be an operation that applies a high voltage for a certain time for each memory cell in the page 111. The authorizing of the high voltage may induce stress on each memory cell and may cause physical damage for each memory cell.

The data storing operation of the programming unit 120 may be an operation that changes a threshold voltage for each memory cell in the page 111. Since the data storing operation may increase the wear-level of each memory cell, adjusting the data storing operation to reduce a number of memory cells having a threshold that varies is desirable.

The inversion determining unit 130 of an example embodiment may determine whether to perform inversion of the data page to adjust the number of memory cells having the threshold voltage that varies to be less than a number of memory cells having a threshold voltage that does not vary in the memory cell of the page 111 during the data storing operation of the programming unit 120.

The flash memory device 100 may reduce stress of the memory cells in the page 111 as in the described configuration, and also reduce the wear-level and physical damage with respect to the memory cells.

The flash memory device 100 may not store information about whether the inversion determining unit 130 inverts the data page in the memory cell array 110.

The data verifying unit 140 may read the programming page stored in the page 111 in the memory cell array 110. The data verifying unit 140 may restore the data page from the programming page depending on whether an error exists in the read programming page and output the restored data page.

When an error exist in the read programming page, the data verifying unit 140 may invert the read programming page and restore the data page. When information with respect to a relation between the data page and programming page is not stored in the memory cell array 110, the data verifying unit 140 may assume that the data page is not inverted and generated as the programming page, and may perform error detection with respect to the read programming page. When the error exists in the read programming page, the data verifying unit 140 may verify that the assumption with respect to the programming page is incorrect. When the error exist in the read programming page, the data verifying unit 140 may invert the read programming page to restore the data page and output the restored data page.

Depending on applications, a frequency of '0' being stored in the memory cell array 110 may be higher than a frequency of '1' being stored in the memory cell array 110. In this instance, the data verifying unit 140 may assume that the data page is inverted and generated as the programming page, and may invert the read programming page and perform error detection.

An error detecting method with respect to the programming page that the data verifying unit 140 read includes a detecting of an error from error control codes (ECC) included in the read programming page, an ECC decoding of the read programming page, and a detecting of a parity included in the read programming page.

The flash memory device 100 may not separately store information about whether the data page is inverted in the memory cell array 110 and may use the ECC or parity already included in the data page during the restoring of the data page, and thereby can reduce overhead with respect to space for storing data.

Figure 2:
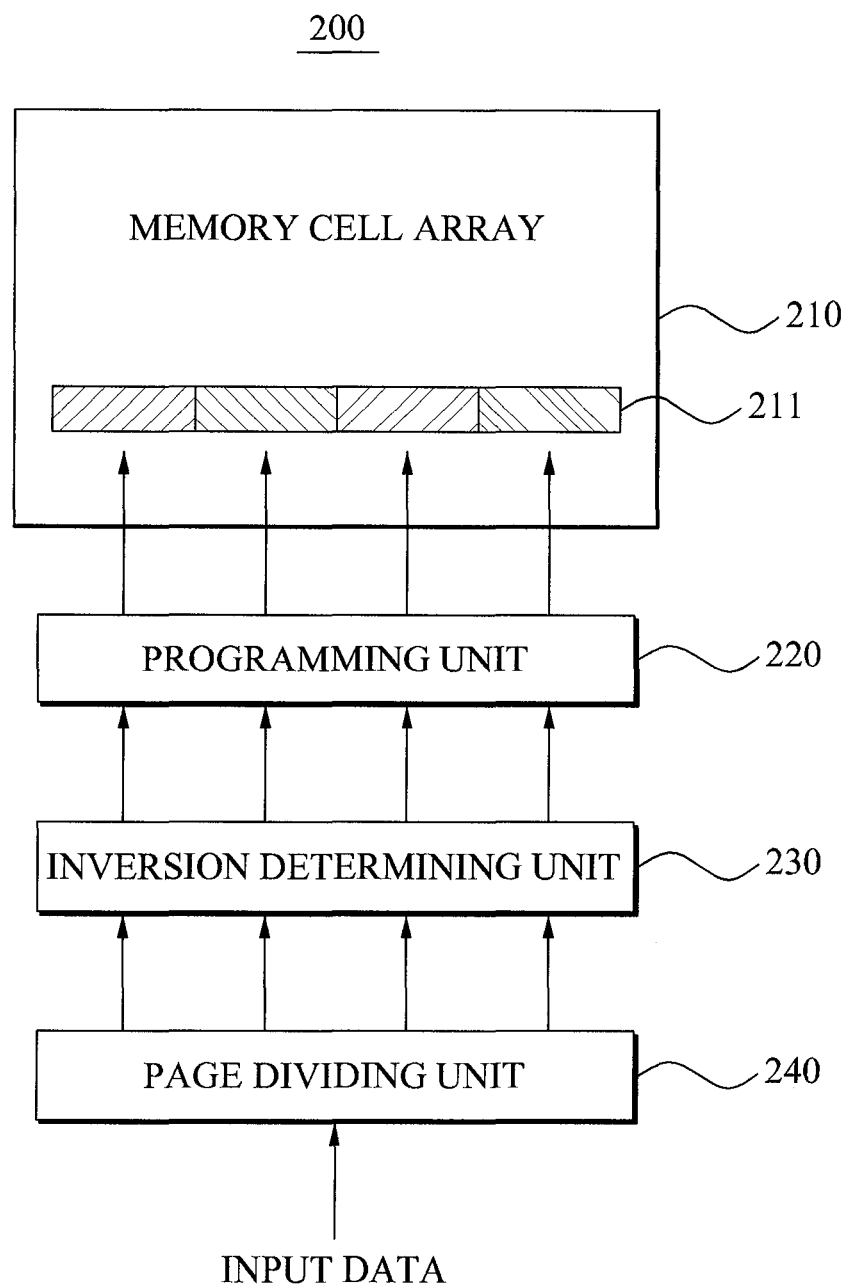
FIG. 2 illustrates a flash memory device according to another example embodiment.

FIG. 2 illustrates a flash memory device 200 according to another example embodiment.

Referring to FIG. 2, the flash memory device 200 includes a memory cell array 210, programming unit 220, inversion determining unit 230, and page dividing unit 240.

The memory cell array 210 may include a page 211.

Each of the programming unit 220, inversion determining unit 230, and page dividing unit 240 may included in a peripheral circuit of the flash memory device or a controller of the flash memory device 200.

The page dividing unit 240 may divide a data page into a plurality of data sub-pages.

The inversion determining unit 230 determines whether to perform inversion with respect to each data sub-page. The inversion determining unit 230 generates each programming page corresponding to each data sub-page through inverting or not inverting each data sub-page based on a number of '1's and '0's in each data sub-page.

Example embodiment where a page dividing unit 240 divides a single data page into four data sub-pages is illustrated in FIG. 2.

The inversion determining unit 230 determines whether to perform inversion with respect to each of the four data sub-pages.

The programming unit 220 stores each generated programming page in the page 211 of the memory cell array 210.

The programming unit 220 stores an inversion flag denoting whether the programming page is generated through inverting the data sub-page in the memory cell array. The inversion flag may be generated with respect to each data sub-page. The programming unit 220 may store the inversion flag in a subsidiary region in the page 211.

The inversion determining unit 230 may determine whether to perform inversion with respect to each data sub-page. When a number of '0's is greater than a number of '1's in a first data sub-page, the inversion determining unit 230 may invert a first data sub-page and generate the first programming page, and when a number of '0's is not greater than a number of '1's in a second data sub-page, the inversion determining unit 230 may not invert the second data sub-page and may generate a second programming page.

A data storing operation of the programming unit 220 may be an operation of changing a threshold voltage of each memory cell in the page 211. In this instance, the inversion determining unit 230 may determine whether to perform inversion of the data page to adjust a number of memory cells having a threshold voltage that varies to be less than a number of memory cells having a threshold voltage that does not vary in the memory cells in the page 211 during the data storing operation of the programming unit 220.

The flash memory device 200 may further include a data verifying unit (not illustrated). The data verifying unit may read each programming page stored in the page 211 in the memory cell array 210 and the inversion flag stored in the memory cell array 210. The data verifying unit may restore each data sub-page through inverting or not inverting each read programming page depending on the read inversion flag. The data verifying unit may restore the data page through combining the restored data sub-pages.

As another example embodiment, the flash memory device 200 may further include a data verifying unit (not illustrated). The data verifying unit may read each programming page stored in the page 211 in the memory cell array 210. The data verifying unit may restore each data sub-page from each programming page depending on whether an error exists in each read programming page. The data verifying unit may restore the data page through combining the restored data sub-pages. In this instance, the flash memory device 200 may not store information about whether each data sub-page is inverted in the memory cell array 210. The data verifying unit may determine whether to perform inversion with respect to each read programming page. That is, when the error exists in a first read programming page, the data verifying unit inverts the first read programming page and generates the first data sub-page, and when the error exists in a second read programming page, the data verifying unit may not invert the second read programming page and generate the second data sub-page. The data verifying unit may perform ECC decoding each read programming page or check a parity of each read programming page to verify existence of the error.

Another flash memory device (not illustrated) of the present invention may verify whether a page is inverted during an read operation when an ECC or parity is stored in a subsidiary region of the page as meta information even though inversion information with respect to each region is not stored, and thereby can restore normal data.

Figure 3:
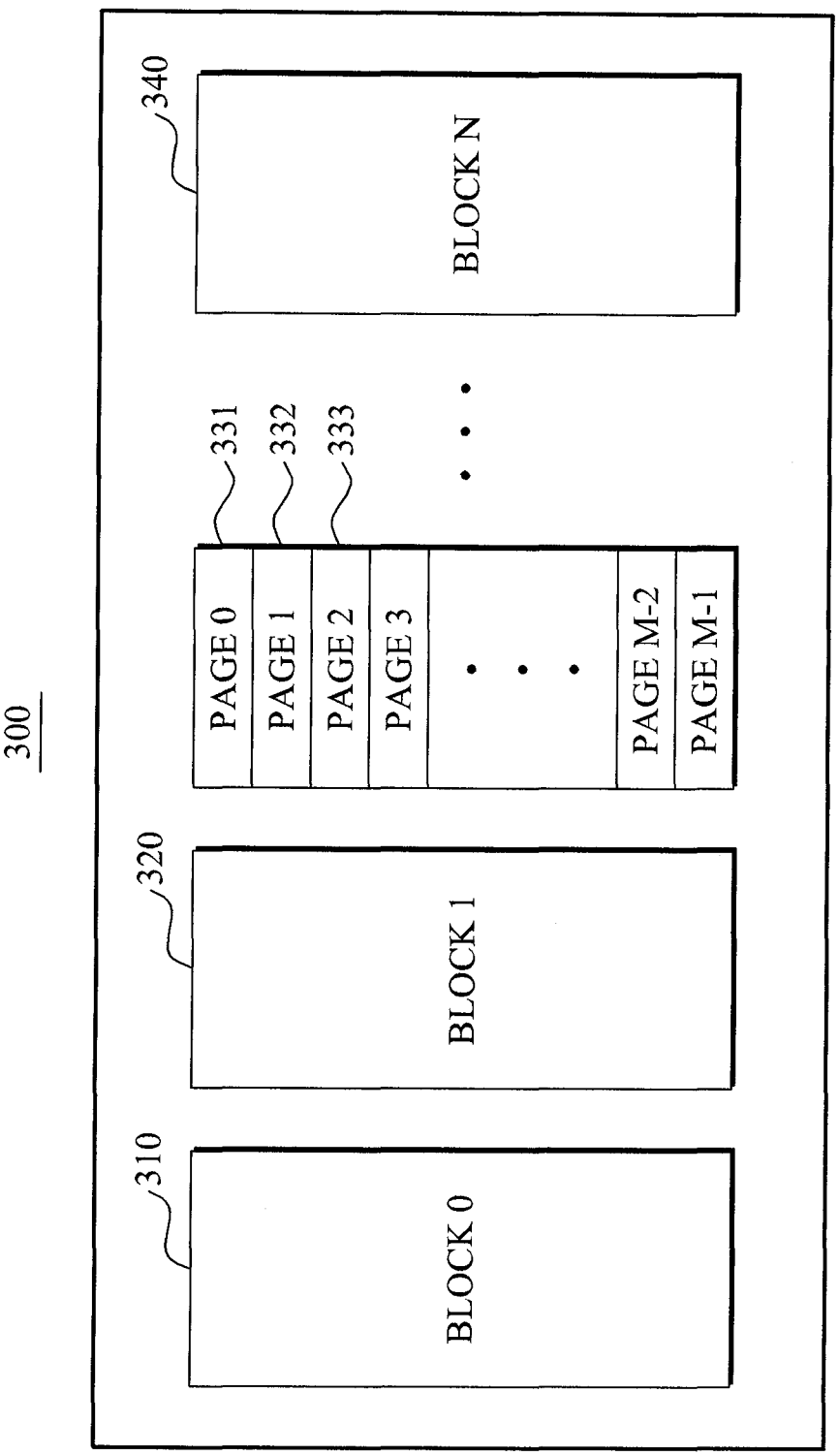
FIG. 3 illustrates a memory cell array according to another example embodiment.

FIG. 3 illustrates a memory cell array according to another example embodiment.

Referring to FIG. 3, a memory cell array includes (N+1) blocks.

The memory cell array includes a block 0 310, block 1 320, and block N 340. Each block is a unit for performing an erase operation.

Each block includes M pages.

Page 0 331, page 1 332, page 2 333, page 3 334, and the like are included in FIG. 3.

Each page is a unit for performing a program operation.

When data stored in a single page is updated, the updated data is stored after an entire block included in the page is erased and initialized.

Figure 4:
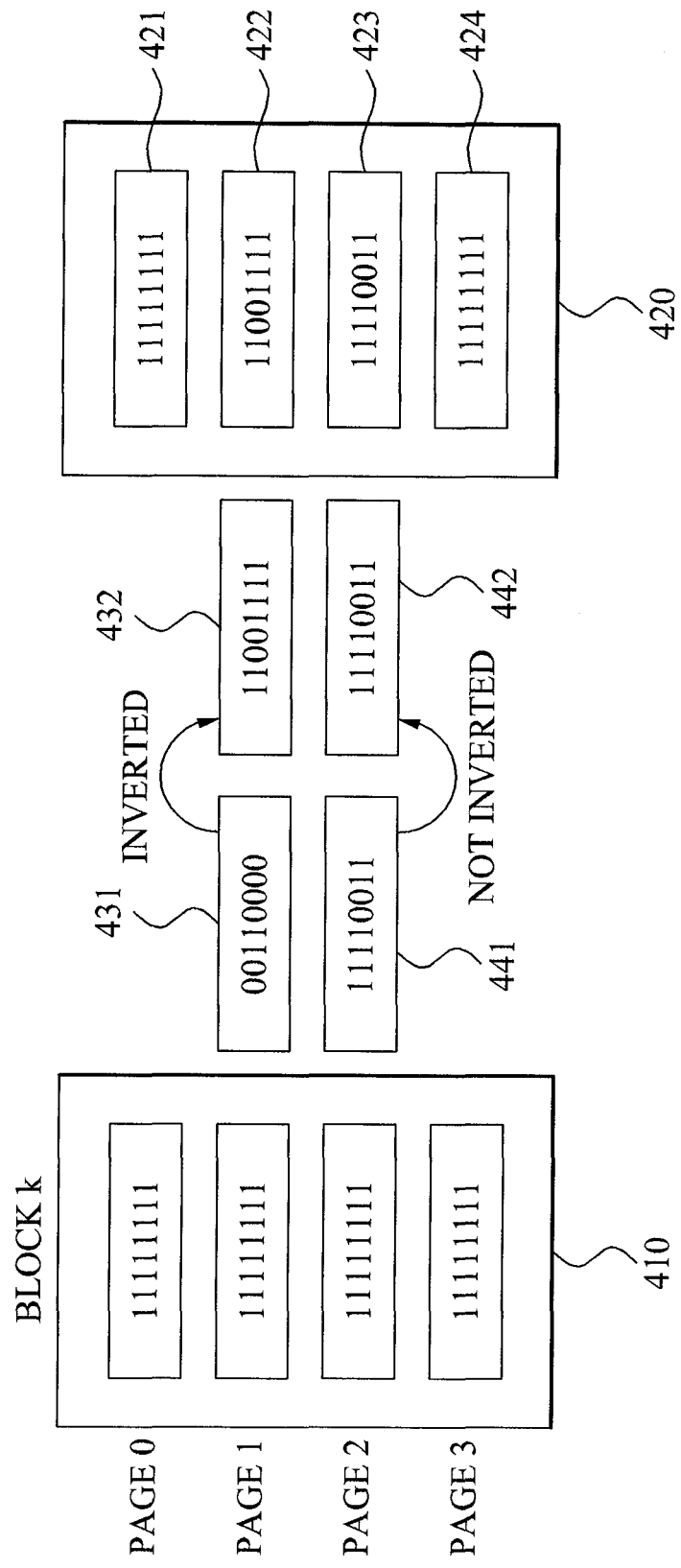
FIG. 4 illustrates a memory programming method performed in a flash memory device according to an example embodiment.

FIG. 4 illustrates a memory programming method performed in a flash memory device 100.

Referring to FIG. 4, an initialized block K 410 may include four pages. For convenience of description, it is assumed that a block is already initialized in the memory programming method of FIG. 4.

A data page transferred to the flash memory device 100 by a controller is a first data page 431 and a second data page 441. The first data page and the second data page respectively correspond to a second page and third page of an initialized block K 410.

The flash memory device 100 compares a number of '0's with a number of '1's in the first data page 431. For convenience of description, it is assumed that the first data page 431 is eight bits. Since the number of '0's is six and the number of '1's is two in the first data page 431, the flash memory device may invert the first data page 431 and generate a first programming page 432.

The flash memory device 100 compares a number of '0's with a number of '1's in a second data page 441. Since the number of '0's is two and the number of '1's is six in the second data page 441, the flash memory device may not invert the second data page 441 and generate a second programming page 442.

The flash memory device 100 may store the generated first programming page 432 in the second page 422 in a block K 420 and store the generated second programming page 442 in a third page 423 in the block K 420.

A first page 421 and fourth page 424 in the block K 420 remains in an initialized state.

Figure 5:
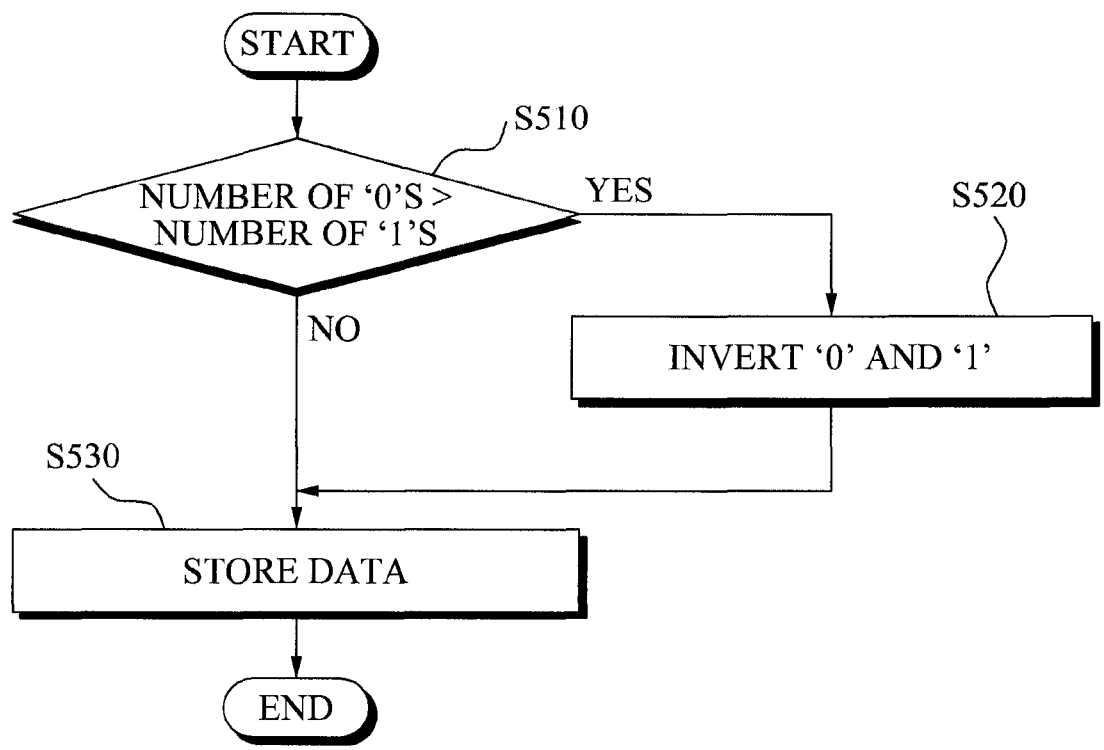
FIG. 5 is an operational flowchart illustrating the memory programming method performed in the flash memory device of FIG. 4.

FIG. 5 is an operational flowchart illustrating the memory programming method performed in FIG. 4.

Referring to FIG. 5, a memory programming method counts a number of '1's and '0's in a data page in operation S510.

The memory programming method may determine whether to perform inversion of the data page based on the counted number of '1's and '0's.

The memory programming method may generate a programming page from the data page based on the determination on whether to perform inversion.

When the number of '0's is greater than the number of '1's in the data page, the memory programming method inverts the '0's and '1's in operation S520. In this instance, the memory programming method generates the programming page with data wherein the '0's and '1's are inverted.

When the number of '0's is not greater than the number of '1's in the data page, the memory programming method may generate the programming page with the data page.

The memory programming method stores the generated programming page in the memory cell array in operation S530.

Figure 6:
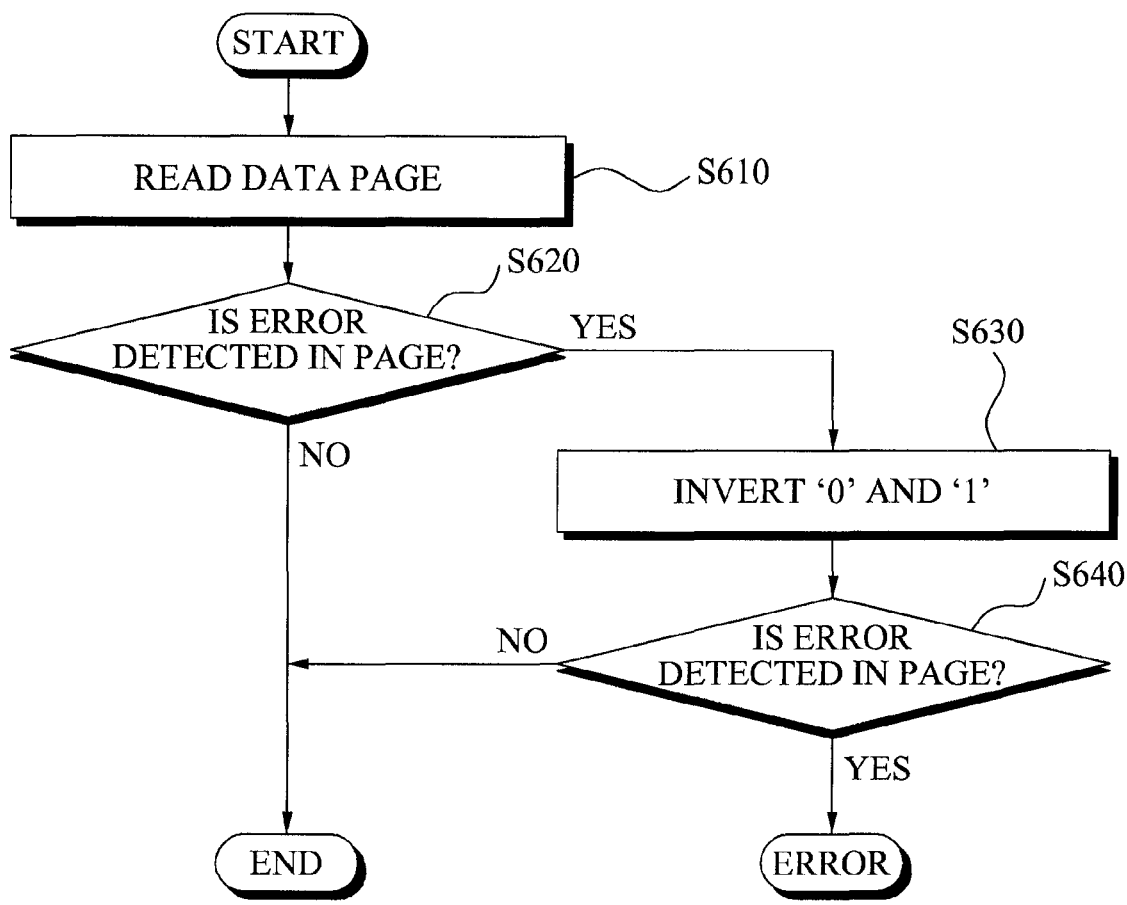
FIG. 6 is an operational flowchart illustrating a memory read method according to an example embodiment.

FIG. 6 is an operational flowchart illustrating a memory read method according to another example embodiment.

Referring to FIG. 6, the memory read method reads programming page stored in a memory cell array in operation S610.

The memory read method verifies whether an error is detected in the read programming page in operation S620.

The memory read method may determine whether to perform inversion of the read programming page depending on whether the error exists in the read programming page.

The memory read method may restore a data page from the read programming page based on the determination on whether to perform inversion.

When the error is detected in the read programming page, the memory read method inverts '0' and '1' in the read programming page in operation S630.

The memory read method verifies whether the error is detected in the inverted programming page in operation S640.

When the error is detected in the inverted programming page, the memory read method determines that the read programming page contains an error. In this instance, the memory read method may read the programming page again.

When the error is not detected in the inverted programming page, the method restores the inverted programming page to the data page.

Figure 7:
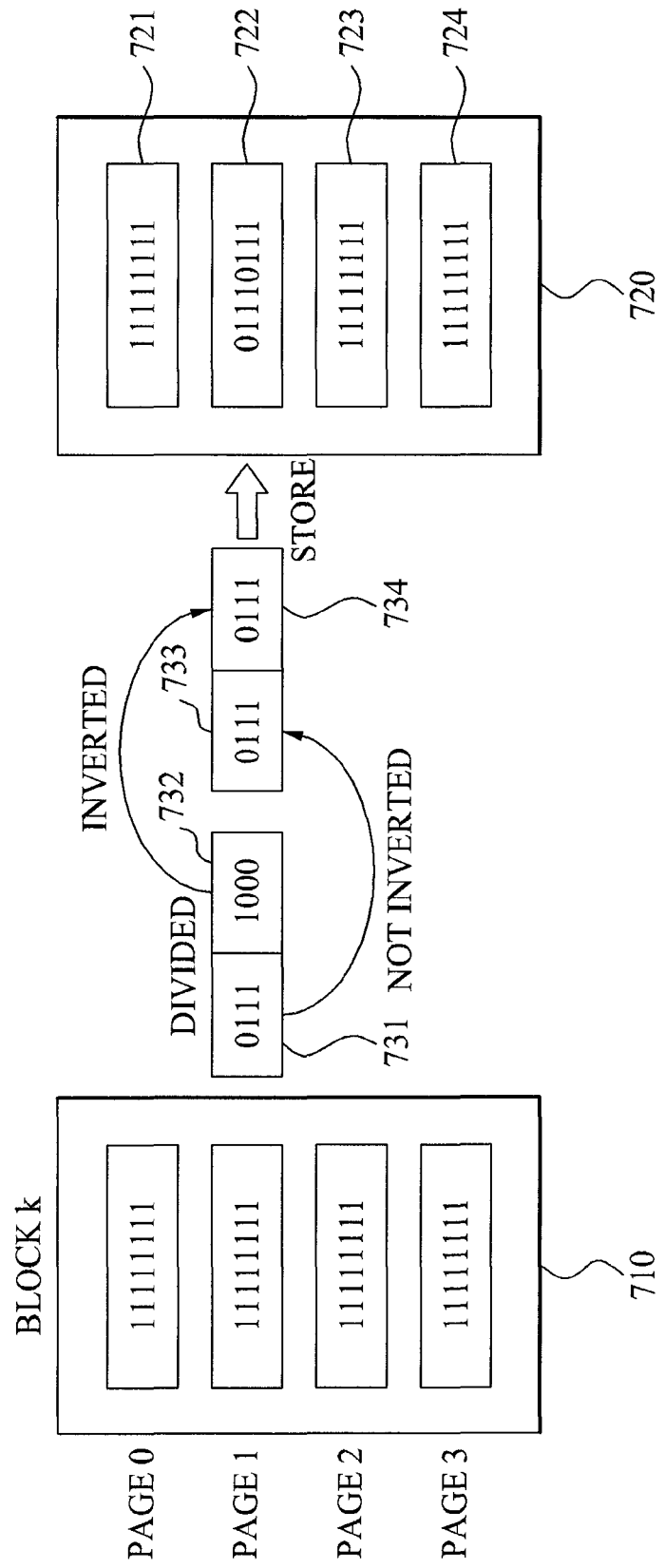
FIG. 7 illustrates a memory programming method performed in a flash memory device according to another example embodiment.

FIG. 7 illustrates a memory programming method performed in the flash memory device 200 of the present invention.

Referring to FIG. 7, an initialized block K 710 include four pages. For convenience of description, it is assumed that a block is already initialized in the memory programming method of FIG. 7.

A data page transferred to the memory device 200 by a controller corresponds to a second page of the initialized block K 710.

The flash memory device 200 divide the data page into two sub-pages.

A first divided data sub-page 731 includes one '0' and three '1's.

The flash memory device 200 generates a first programming sub-page 733 without inverting the first data sub-page 731.

A second divided data sub-page 732 includes three '0's and one '1'.

The flash memory device 200 generates a second programming sub-page 734 through inverting the second data sub-page 732.

The flash memory device 200 stores the generated first programming sub-page 733 and second programming sub-page 734 in a second page 722 in the block K720.

A first page 721, third page 723, and fourth page 724 in the block K 720 remain in an initialized state.

Figure 8:
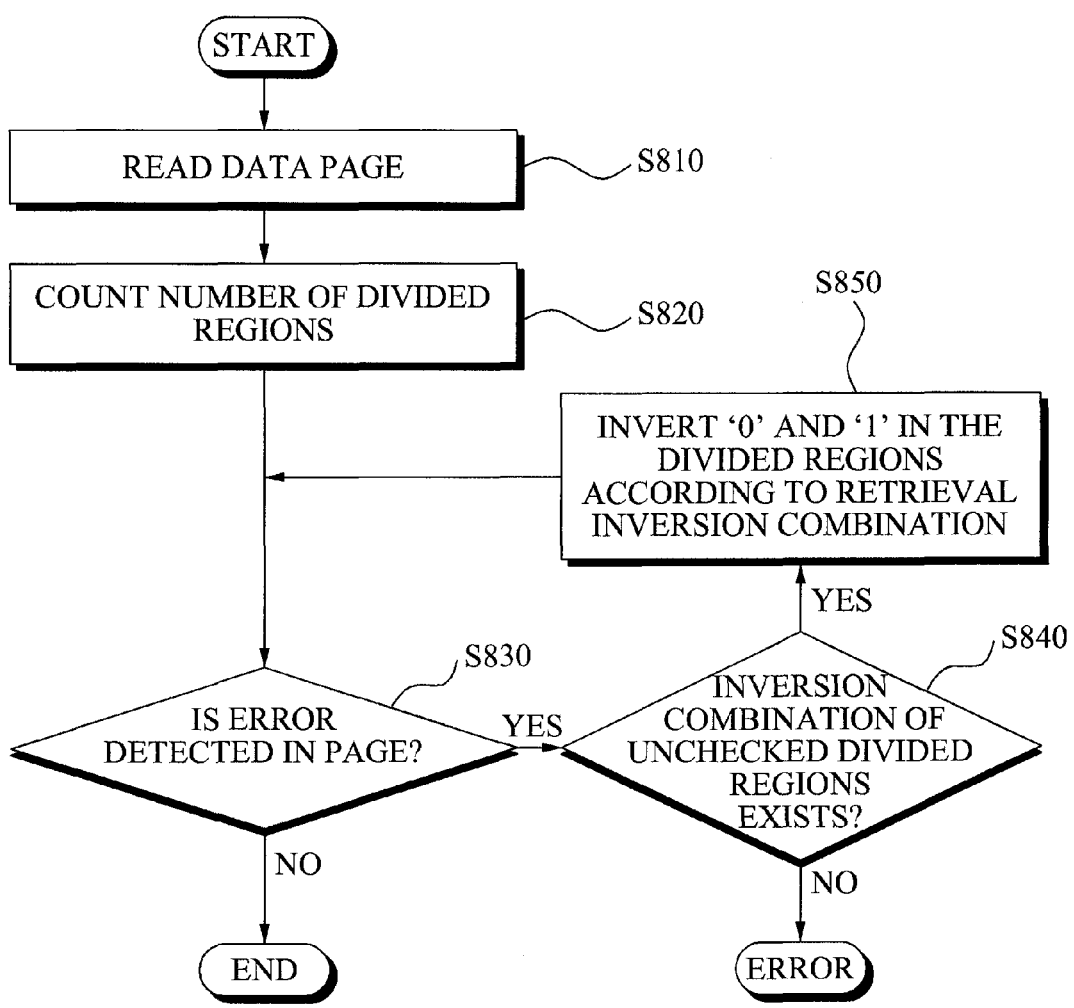
FIG. 8 is an operational flowchart illustrating a memory read method according to another example embodiment.

FIG. 8 is an operational flowchart illustrating a memory read method performed in a flash memory device.

Referring to FIG. 8, the memory read method reads a programming page from a memory cell array 210 in operation S810.

The memory read method counts for a number of divided regions in the programming page in operation S820. In this instance, information about division of the programming page may be stored in a subsidiary region of the programming page as meta-information.

The memory read method verifies whether an error is detected in the read programming page in operation S830.

When the error is not detected, the memory read method may restore the read programming page as a data page and output the restored data page to a controller.

When the error is detected, the memory read method may search for an inversion combination of unchecked divided regions with respect to the read programming page in operation S840.

The memory read method inverts '0' and '1' in the divided regions according to the retrieval inversion combination in operation S850.

The memory read method verifies whether the error is detected in the inverted programming page again in operation S830.

As a result of searching in operation S840, when there is no more inversion combination, the memory read method may finally determine that the read programming page contains an error.

When it is finally determined that the page contains the error, the memory read method may read the programming page from the memory cell array again.

When a number of the divided regions is $N=2^k$, the memory read method may use a value that is stored as meta-information in a subsidiary region or a predetermined value as k. The memory read method may perform error detection with respect to a page using an ECC or parity, and as a result of the error detection, when there is no error, the memory read method may determine that an inverted region does not exist.

When the programming page is divided into N regions, the error detection using the ECC or parity may be repeated a maximum of $2^N$ times and parallel processing using a hardware circuit is possible.

Referring to FIG. 2 again, the page dividing unit 240 may divide the data page into a certain number of data sub-pages with a certain size to minimize a number of '0's that are physically stored. In this instance, information related to the division and inversion may be stored in a subsidiary region in the page 211. The stored division and inversion information may be used to restore the data page during a read operation.

When dividing the data page into four data sub-pages, the page dividing unit 240 may allow a first data sub-page to include a-bits, a second data sub-page to include b-bits, a third data sub-page to include c-bits, and a fourth data sub-page to include d-bits.

In this instance, the programming page 220 may store four division information with respect to the four data sub-pages in the page 211. Each division information may include a size of the divided data sub-pages a-bits, b-bits, c-bits, and d-bits. The programming unit 220 may store the four division information together with inversion information about whether each data sub-page is inverted in the page 211.

When the division and inversion information is meta-information, since the meta-information indicates a size (bits) of each data sub-page and whether each data sub-page is inverted, when the size of each data sub-page is expressed with x-bits, the meta-information may need (x+1) bits.

As a number of divided data sub-pages increases, a size of the meta-information increase and a process for restoring the data page becomes complex. The page dividing unit 240 may determine an optimum number of divisions based on the size of the meta-information and complexity of the restoring process.

According to the present invention, a life span of the flash memory may be prolonged through using a new programming method.

Also, according to the present invention, a wear-level in a memory cell level may be equalized through using the new programming method and a new data detecting method.

The memory programming method and memory read method according to example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as floptical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of example embodiments.

Flash memory devices and/or memory controllers according to example embodiments may be embodied using various types of packages. For example, the flash memory devices and/or memory controllers may be embodied using packages such as Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In this case, the memory controllers may be constructed to communicate with an external device for example, a host using any one of various types of protocols such as a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that can maintain stored data even when power is cut off. According to an increase in the use of mobile devices such as a cellular phone, a personal digital assistant (PDA), a digital camera, a portable game console, and an MP3 player, the flash memory devices may be more widely used as data storage and code storage. The flash memory devices may be used in home applications such as a high definition television (HDTV), a digital video disk (DVD), a router, and a Global Positioning System (GPS).

A computing system according to example embodiments may include a microprocessor that is electrically connected with a bus, a user interface, a modem such as a baseband chipset, a memory controller, and a flash memory device. The flash memory device may store N-bit data via the memory controller. The N-bit data is processed or will be processed by the microprocessor and N may be 1 or an integer greater than 1. When the computing system is a mobile apparatus, a battery may be additionally provided to supply operation voltage of the computing system.

It will be apparent to those of ordinary skill in the art that the computing system according to example embodiments may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

The invention claimed is:

1. A memory device, comprising:
   a memory cell array;
   an inversion determining unit adapted to generate a programming page through inverting or not inverting a data page based on a number of '1's and a number of '0's in the data page;
   a programming unit adapted to store the programming page in the memory cell array; and
   a data verifying unit adapted to read the programming page stored in the memory cell array, determine whether to perform inversion of a programming page according to whether an error exists in the programming page, restore the data page from the programming page according to the determination on whether to perform inversion of the programming page, and output a restored data page.

2. The memory device of claim 1, wherein the inversion determining unit generates the programming page through inverting the data page when the number of '0's is greater than the number of '1's in the data page.

3. The memory device of claim 1, wherein the inversion determining unit determines whether to perform inversion of the data page to make a number of memory cells with a threshold voltage that varies to be less than a number of memory cells with a threshold voltage that does not vary in the memory cell array, while the programming unit stores the programming page.

4. The memory device of claim 1, wherein the data verifying unit inverts the programming page to restore the data page when the error exists in the programming page.

5. The memory device of claim 1, wherein the data verifying unit verifies existence of the error through either Error Correction Codes (ECC) decoding the programming page or checking a parity of the programming page.

6. The memory device of claim 1, wherein information about whether the programming page is generated through inversion of the data page is not stored in the memory cell array.

7. The memory device of claim 1, further comprising a page dividing unit adapted to divide the data page into a plurality of data sub-pages,
   wherein the programming page comprises a plurality of programming sub-pages and/or divided regions, each of the plurality of programming sub-pages individually corresponding to each of the plurality of data sub-pages through inverting or not inverting each of the plurality of data sub-pages based on a number of '1's and a number of '0's in each of the plurality of data sub-pages,
   the programming unit adapted to combine each of the plurality of programming sub-pages in the programming page,
   the data verifying unit adapted to read the programming page comprising the plurality of programming sub-pages or divided regions, restore the data sub-pages of the programming page according to the determination on whether to perform inversion of the programming page, and restore the data page by combining the data sub-pages.

8. The memory device of claim 7, wherein the data verifying unit restores each of the plurality of data sub-pages through inverting the programming page, when the error exists in the programming page.

9. The memory device of claim 7, wherein the data verifying unit verifies existence of the error through either Error Correction Codes (ECC) decoding the programming page or checking a parity of the programming page.

10. A memory device, comprising:
    a memory cell array;
    a page dividing unit adapted to divide a data page into a plurality of data sub-pages;
    an inversion determining unit adapted to generate a programming page comprising a plurality of programming sub-pages and/or divided regions, each of the plurality of programming sub-pages individually corresponding to each of the plurality of data sub-pages through inverting or not inverting each of the plurality of data sub-pages based on a number of '1's and a number of '0's in each of the plurality of data sub-pages;
    a programming unit adapted to combine each of the plurality of programming sub-pages in the programming page and store the programming page to the memory cell array, wherein information about whether each of the plurality of data sub-pages is inverted is not stored in the memory cell array or in the memory device; and
    a data verifying unit adapted to read the programming page comprising the plurality of programming sub-pages or divided regions stored in the memory cell array, restore the data page from the programming page through searching for an inversion combination of the plurality of programming sub-pages and/or divided regions of the programming page that does not result in an error existing in the programming page, and output a restored data page.

11. The memory device of claim 10, wherein the inversion determining unit generates the plurality of programming sub-pages through inverting each of the plurality of data sub-pages when the number of '0's is greater than the number of '1's in each of the plurality of data sub-pages.

12. The memory device of claim 10, wherein the inversion determining unit determines whether to perform inversion of each of the plurality of data sub-pages to make a number of memory cells having a threshold voltage that varies to be less than a number of memory cells having a threshold voltage that does not vary in the memory cell array, while the programming unit stores the programming page.

13. A memory programming method, the method comprising:
    determining whether to perform inversion of a data page based on a number of '1's and a number of '0's in the data page;
    generating a programming page from the data page according to the determination on whether to perform inversion of the data page;
    storing the programming page in a memory cell array;
    reading the programming page stored in the memory cell array;
    determining whether to perform inversion of the programming page depending on whether an error exists in the programming page; and
    restoring the data page from the programming page according to the determination on whether to perform inversion of the programming page.

14. The method of claim 13, wherein the generating of the programming page from the data page determines to perform inversion of the data page when a number of '0's is greater than a number of '1's in the data page.

15. The method of claim 13, wherein the determining of whether to perform inversion of the programming page determines to perform inversion of the programming page when the error exists in the programming page.

16. The method of claim 13, wherein further comprising dividing the data page into a plurality of data sub-pages prior to determining whether to perform inversion of the data page, wherein determining of whether to perform inversion of the data page comprises determining whether to perform inversion of each of the plurality of data sub-pages based on a number of '1's and a number of '0's in each of the plurality of data sub-pages, wherein the a programming page comprises a plurality of programming sub-pages and/or divided regions, each of the plurality of programming sub-pages individually corresponding to each of the plurality of data sub-pages according to the determination on whether to perform inversion of each of the plurality of data sub-pages, wherein determining whether to perform inversion of the programming page comprises determining whether to perform inversion of each of the plurality of programming sub-pages depending on whether an error exists in the programming page, wherein restoring the data page comprises combining the data sub-pages according to the determination on whether to perform inversion of each of the programming sub-pages.

17. A memory programming method, the method comprising:
dividing a data page into a plurality of data sub-pages;
determining whether to perform inversion of each of the plurality of data sub-pages based on a number of '1's and a number of '0's in the each of the plurality of data sub-pages;
generating a programming page comprising a plurality of programming sub-pages and/or divided regions, each of the plurality of programming sub-pages individually corresponding to each of the plurality of data sub-pages according to the determination on whether to perform inversion of each of the plurality of data sub-pages;
storing each programming page to a memory cell array on a memory device, wherein information about whether each of the plurality of data sub-pages is inverted is not stored in the memory cell array or in the memory device;
reading the programming page stored in the memory cell array;
determining whether to perform inversion of each of the plurality of programming sub-pages by searching for an inversion combination of the plurality of programming sub-pages and/or divided regions of the programming page that does not result in an error existing in the programming page; and
restoring the data page from the programming page according to the determination on whether to perform inversion of each of the programming sub-pages.

18. A memory controller storing a program for implementing a memory programming method, the method comprising:
determining whether to perform inversion of a data page based on a number of '1's and a number of '0's in the data page;
generating a programming page from the data page according to the determination on whether to perform inversion of the data page;
storing the programming page in a memory cell array;
reading the programming page stored in the memory cell array;
determining whether to perform inversion of the programming page depending on whether an error exists in the programming page; and
restoring the data page from the programming page according to the determination on whether to perform inversion of the programming page.

19. The memory controller of claim 18, wherein the method further comprises dividing the data page into a plurality of data sub-pages prior to determining whether to perform inversion of the data page, wherein determining of whether to perform inversion of the data page comprises determining whether to perform inversion of each of the plurality of data sub-pages based on a number of '1's and a number of '0's in each of the plurality of data sub-pages, wherein the a programming page comprises a plurality of programming sub-pages and/or divided regions, each of the plurality of programming sub-pages individually corresponding to each of the plurality of data sub-pages according to the determination on whether to perform inversion of each of the plurality of data sub-pages, wherein determining whether to perform inversion of the programming page comprises determining whether to perform inversion of each of the plurality of programming sub-pages depending on whether an error exists in the programming page, wherein restoring the data page comprises combining the data sub-pages according to the determination on whether to perform inversion of each of the programming sub-pages.

20. A memory controller storing a program for implementing a memory programming method, the method comprising:
dividing a data page into a plurality of data sub-pages;
determining whether to perform inversion of each of the plurality of data sub-pages based on a number of '1's and a number of '0's in each of the plurality of data sub-pages;
generating a programming page comprising a plurality of programming sub-pages and/or divided regions, each of the plurality of programming sub-pages individually corresponding to each of the plurality of data sub-pages according to the determination on whether to perform inversion of each of the plurality of data sub-pages;
storing the programming page to a memory cell array on a memory device, wherein information about whether each of the plurality of data sub-pages is inverted is not stored in the memory cell array or in the memory device;
reading the programming page stored in the memory cell array;
determining whether to perform inversion of each of the plurality of programming sub-pages by searching for an inversion combination of the plurality of programming sub-pages and/or divided regions of the programming page that does not result in an error existing in the programming page; and
restoring the data page from the programming page according to the determination on whether to perform inversion of each of the programming sub-pages.

* * * * *